United States Patent
Hung

(10) Patent No.: US 7,872,896 B2
(45) Date of Patent: Jan. 18, 2011

(54) MAGNETIC SHIFT REGISTER AND OPERATION METHOD THEREOF

(75) Inventor: Chien-Chung Hung, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 150 days.

(21) Appl. No.: 12/272,760

(22) Filed: Nov. 17, 2008

(65) Prior Publication Data

US 2010/0080034 A1 Apr. 1, 2010

(30) Foreign Application Priority Data

Sep. 26, 2008 (TW) .............................. 97137208 A

(51) Int. Cl.
*G11C 19/02* (2006.01)
(52) U.S. Cl. .......................................... 365/80; 365/83
(58) Field of Classification Search ................... 365/80, 365/83

See application file for complete search history.

(56) References Cited

U.S. PATENT DOCUMENTS

| 6,834,005 | B1 | 12/2004 | Parkin |
| 6,898,132 | B2 | 5/2005 | Parkin |
| 6,955,926 | B2 | 10/2005 | Chen et al. |
| 7,236,386 | B2 * | 6/2007 | Parkin ......................... 365/80 |

OTHER PUBLICATIONS

Article titled "Scalable Cell Technology Utilizing Domain Wall Motion for High-speed MRAM" authored by Numata, et al., 2007 Symposium on VLSI Technology Digest of Technical Papers, pp. 232-233.

\* cited by examiner

*Primary Examiner*—Tan T. Nguyen
(74) *Attorney, Agent, or Firm*—Jianq Chyun IP Office

(57) ABSTRACT

A magnetic shift register includes at least a magnetic memory track of which several walls separate the memory track into multiple magnetic domains to serve as magnetic binary memory cells. The magnetic memory track includes multiple data regions. Each data region has multiple of the magnetic binary memory cells for storing bit data at a quiescent state and registering at least one of the bit data shifted from the adjacent data region at a shifting state. Wherein, the bit data of the magnetic binary memory cells is shifted between the adjacent two data region under an operation current.

19 Claims, 9 Drawing Sheets

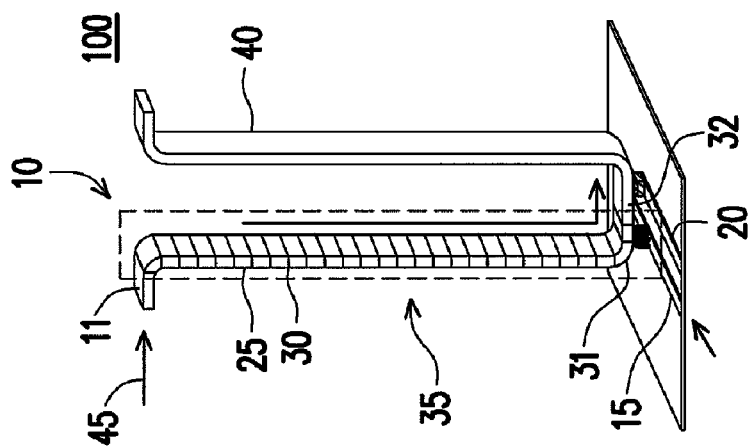
FIG. 1A (PRIOR ART)
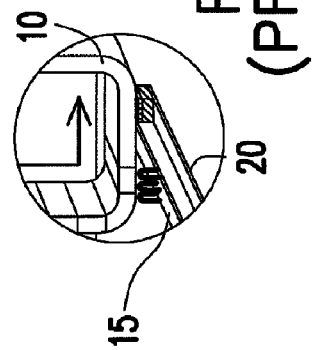
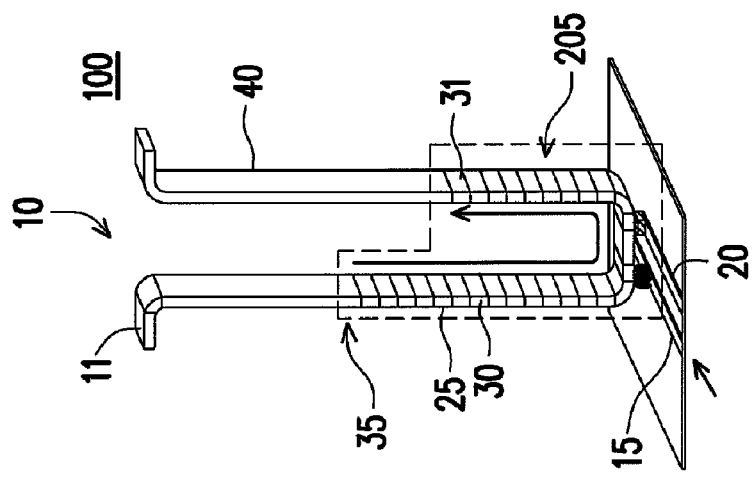
FIG. 1B (PRIOR ART)
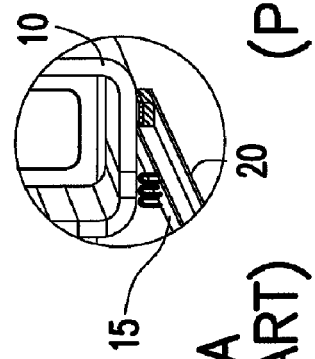
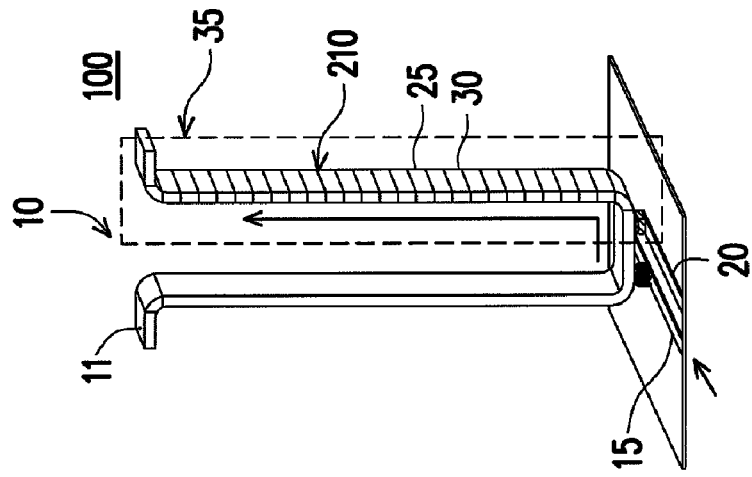
FIG. 1C (PRIOR ART)
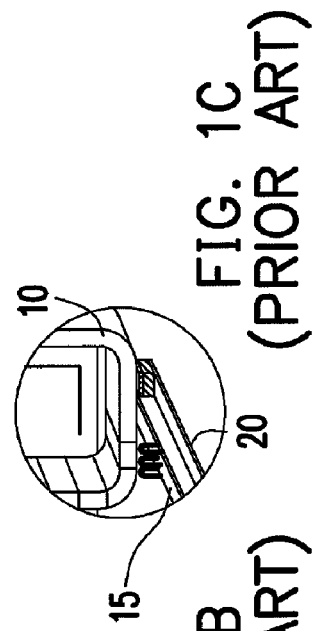

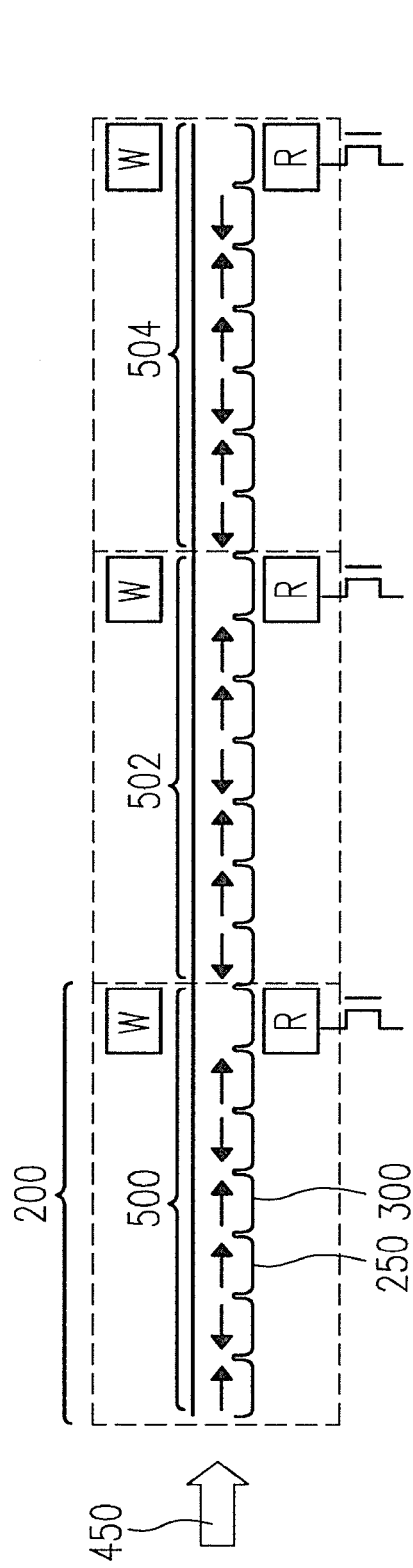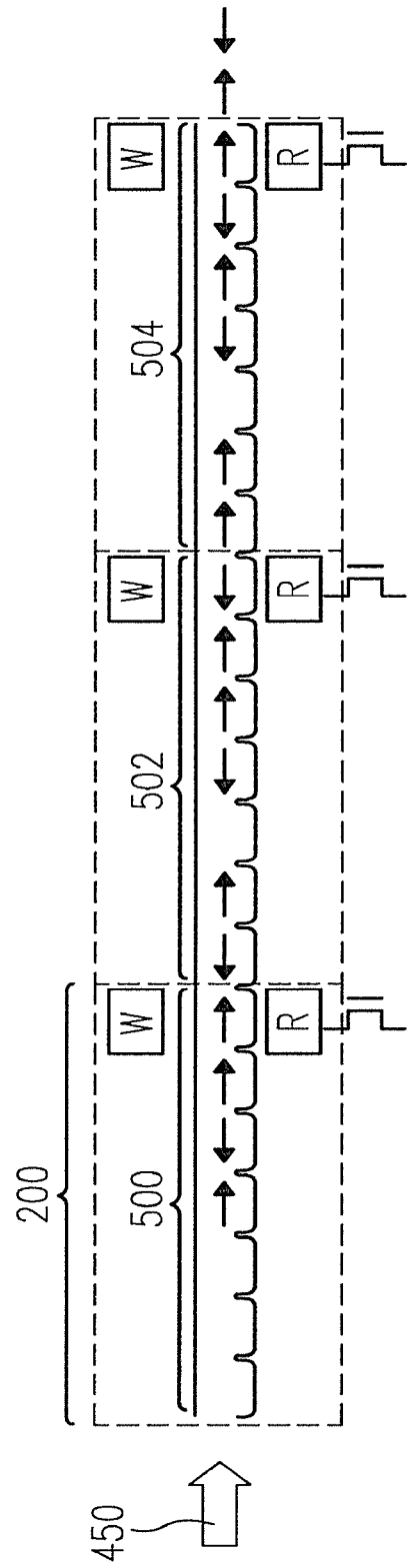

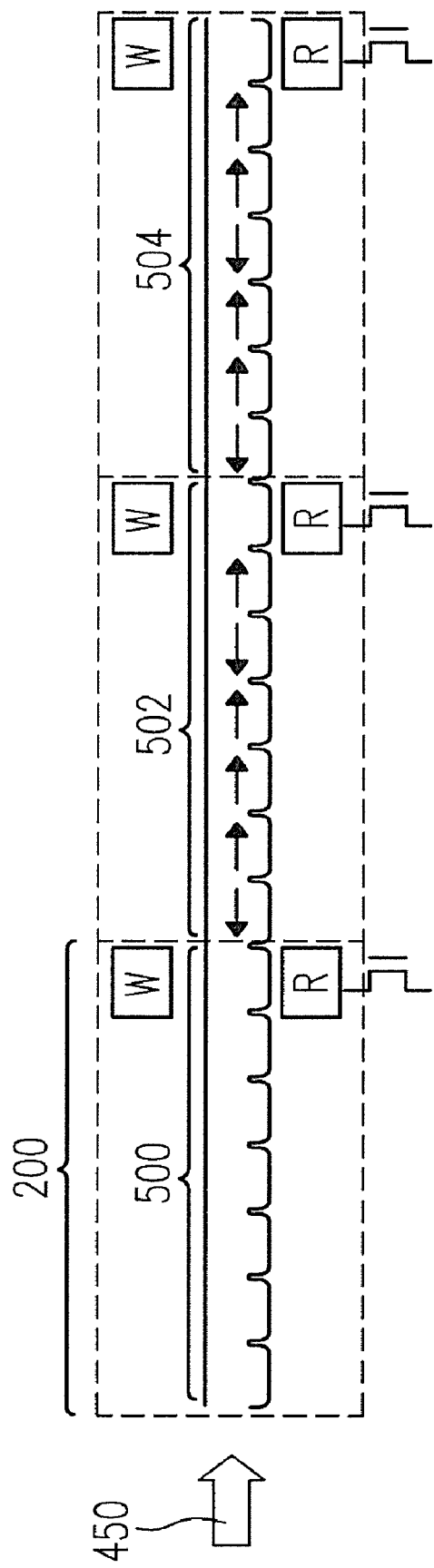

MAGNETIC SHIFT REGISTER AND OPERATION METHOD THEREOF

CROSS-REFERENCE TO RELATED APPLICATION

This application claims the priority benefit of Taiwan application serial no. 97137208, filed on Sep. 26, 2008. The entirety of the above-mentioned patent application is hereby incorporated by reference herein and made a part of this specification.

BACKGROUND OF THE INVENTION

1. Field of the Invention

The present invention relates to a magnetic shift register.

2. Description of Related Art

A magnetic random access memory (MRAM) has advantages of non-volatile, high density, high accessing speed and anti-radiation, etc., which can be used to substitute a conventional semiconductor memory and used for embedded memory applications. The conventional magnetic field writing MRAM device applies metal wires for conducting currents and inducing the magnetic field, so as to switch a free layer of the MRAM. However, as a size of the MRAM decreases, a demagnetizing field effect is quickly increased, and the required write current is greatly increased, so that miniaturization of the MRAM is difficult.

Recently, a spin-torque-transfer switching (STT) technique is provided according to the conventional technique, which is also referred to as a spin-RAM technique. Such technique is a new generation of magnetic memory writing technique, by which the write current directly flows through a memory cell, and as a size of the memory cell decreases, the required write current accordingly decreases, so that such kind of memory can be perfectly miniaturized. However, such STT technique still has disadvantages of inadequate thermal stability of devices, excessive write current, and uncertainty of reliability, etc., which results in enormous obstacles for mass production of such kind of memory.

In addition, a current-driven domain wall motion theory is developed according to the conventional technique during 1998-2004. The U.S. Pat. No. 6,834,005B1 provides a device structure which can greatly improve a storage capacity of a chip or a hard disk, and the device structure is referred to as a magnetic shift register. Such kind of memory has a chance to substitute a current dynamic random access memory (DRAM), a static random access memory (SRAM) and a flash chip, and can even implement "disk drive on a chip". Such memory mainly applies a magnetic disk similar to the hard disk, which is folded in a three-dimensional stack for storing data, in which the current is used for driving a motion of domain walls, so as to record information therein. Therefore, an equivalent bit size thereof can be greatly reduced, and an operation speed thereof exceeds that of a solid flash chip and a hard disk.

FIGS. 1A-1C are operational schematic diagrams of a conventional magnetic shift register. A shift register 100 includes a bit-storage region 35, a bit reservoir region 40, a writing device 15, a reading device 20 and a track 11 for storing and moving data. The shift register 100 is formed by a magnetic metal material such as ferromagnetic materials of NiFe, and CoFe, etc. The track 11 can be magnetized into a plurality of small magnetic domains 25 and 30. Directions of magnetization vectors of the magnetic domains represent logic values 0 and 1 of the stored information. The track 11 of the shift register 100 is serially connected to adjacent tracks. A memory region is separated by one set of the writing device 15 and the reading device 12, and each of the memory regions includes the bit-storage region 35 and the bit reservoir region 40. During a quiescent state for information storage, i.e. a quiescent state without the current-driven domain wall motion, data of the memory cells (for example, the magnetic domain 25 represents data 0 and the magnetic domain 30 represents data 1) are sequentially stored in the bit-storage region 35. Now, none information is stored in the bit reservoir region 40. The reading device 20 of the magnetic shift register is connected to the track 11 via a magnetic tunnelling junction (MTJ), and when the bit information is about to be sequentially read, a current pulse 45 is input to drive each of the magnetic domains 25 and 30 to generate a domain wall motion (DWM) towards a direction of the electron flow.

FIG. 1B illustrates a transient state, in which the bit information located closest to the reading device 20 can be read. In the transient state, the previously read bit information is shifted into the bit reservoir region 40. After all of the bit information stored in the bit-storage region 35 is read, all of the bit information is shifted to the bit reservoir region 40. Then, an inverted current pulse 45 is input to shift all of the bit information back to the bit-storage region 35. When data is written into the magnetic shift register, the magnetic domain to be written is also shifted to a position where the writing device 15 is located by inputting the current pulse 45, and the writing device 15 also shifts a stray field of a specific direction to the writing position via the DWM, so that the magnetic domain is switched to a direction of the data to be written. Thereafter, the sequential information of the magnetic domain is shifted back to an original position via the inverted current pulse 45. According to a common knowledge of the memory, the reading device 20 is connected to a sense amplifier through a select transistor (which can be a MOS transistor), and the transistor occupies a physical area of a Si substrate. Sizes of the magnetic domains 25 and 30 are generally far more smaller than that of the transistor, so that an equivalent bit size of the magnetic shift register is mainly determined by the size of the transistor and a number of the bit information (25 and 30) stored in the bit-storage region 35 that is controlled by the transistor. Since the magnetic shift register includes a plurality of bits, the equivalent bit size can be greatly reduced.

FIG. 2 is a schematic diagram illustrating a mechanism of the magnetic shift register of FIGS. 1A-1C. Referring to FIG. 2, for simplicity's sake, the shift register 100 can be extended on a straight track, and the bit-storage region 35 and the bit reservoir region 40 respectively include a plurality of the magnetic domains 25 and 30. One bit-storage region 35 of the shift register 100 records data of four bits that can be shifted to the bit reservoir region 40. FIG. 3 is a schematic diagram illustrating a reading mechanism. Referring to FIG. 3, a current pulse 106 is for example, input to the shift register 100, so that the magnetic domains 102 and 104 are shifted, and a reading circuit 108 can read bit data from one of the magnetic domains passing through a position where the reading circuit 108 is located. Data to be written into the magnetic domain can be written by a writing circuit.

Basically, design of the conventional magnetic shift register is still not ideal, and the magnetic shift register technique is still in an early stage of development, which requires further improvement.

SUMMARY OF THE INVENTION

The present invention provides a magnetic shift register including at least a magnetic memory track, having a plurality of magnetic domains to serve as magnetic bit memory cells. The magnetic memory track includes a plurality of data regions. Each of the data regions has a plurality of the magnetic bit memory cells for respectively storing a plurality of bit data at a quiescent state and registering at least one of the bit data shifted from the adjacent data region at a shifting state. Wherein, the bit data of the magnetic bit memory cells is shifted between two adjacent data regions under an operation current. Moreover, a memory structure is formed by a plurality of the magnetic memory tracks, and data accessing is performed in coordination with the operation current, a reading circuit and a writing circuit.

The present invention provides a magnetic shift register structure including a plurality of magnetic memory tracks, wherein each of the magnetic memory tracks has a plurality of magnetic bit memory cells. Each of the magnetic memory tracks has a plurality of data regions, and each of the data regions has a plurality of the magnetic bit memory cells for respectively storing a plurality of bit data at a quiescent state and registering at least one of the bit data shifted from the adjacent data region at a shifting state. A current driving unit exerts an operation current to a selected magnetic memory track to shift the magnetic bit memory cells of the data region to an adjacent data region. A reading circuit unit has a reading position at each of the data regions for reading a bit data of a magnetic bit memory cell passing through the reading position within the selected data region. A writing circuit unit has a writing position at each of the data regions for writing a bit data into a magnetic bit memory cell passing through the writing position within the selected data region.

The present invention provides a method for operating a magnetic shift register. The magnetic shift register includes at least a magnetic memory track, having a plurality of magnetic bit memory cells. The magnetic memory track includes at least one first data region and an adjacent second data region. The first data region and the second data region have a same amount of the magnetic bit memory cells, and the first data region stores a plurality of bit data at a quiescent state and registers at least one of the bit data shifted from the second data region at a shifting state. Wherein, the bit data of the magnetic bit memory cells is shifted between the at least two data regions under an operation current. The method includes following steps. First, a first current pulse of a first direction is exerted to the selected magnetic memory track. Wherein, one pulse shifts one bit of data, so as to shift a plurality of data stored in the first data region from an original position to the second data region. Next, a reading step is to read a bit data of the magnetic bit memory cell passing through a reading position, and a writing step is to write a bit data into the magnetic bit memory cell passing through a writing position. Finally, after the data accessing, a second current pulse having a direction inverted to the first direction is exerted, so as to shift the first data region and the second data region back to the original position.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A-1C are operational schematic diagrams of a conventional magnetic shift register.

FIGS. 5A-5C are schematic diagrams illustrating an operation mechanism of a magnetic shift register according to an embodiment of the present invention.

DESCRIPTION OF EMBODIMENTS

The present invention provides a magnetic shift register with a high density, in which by sharing a magnetic bit reservoir region and an adjacent bit-storage region, allocation of additional magnetic bit reservoir region is unnecessary, so that density of memories can be improved about twice.

The present invention is directed to a magnetic shift register, which can improve a memory capacity. Namely, integration density can be improved and cost can be reduced due to sharing of data regions, and thermal stability, reliability and miniaturization of the magnetic shift register can be improved.

The magnetic shift register with the high density includes a track formed by magnetic materials, wherein stored information can be moved on the track. The track includes a plurality of data regions disposed adjacent to each other. The data region can form a plurality of magnetic domains for recording bit data at a quiescent state and registering information of the magnetic domain that is shifted from the adjacent shift register during a current-driven domain wall motion.

In the following content, a plurality of embodiments is provided for describing the present invention, though the present invention is not limited to the provided embodiments, and the provided embodiments can also be mutually combined.

Figure 2:
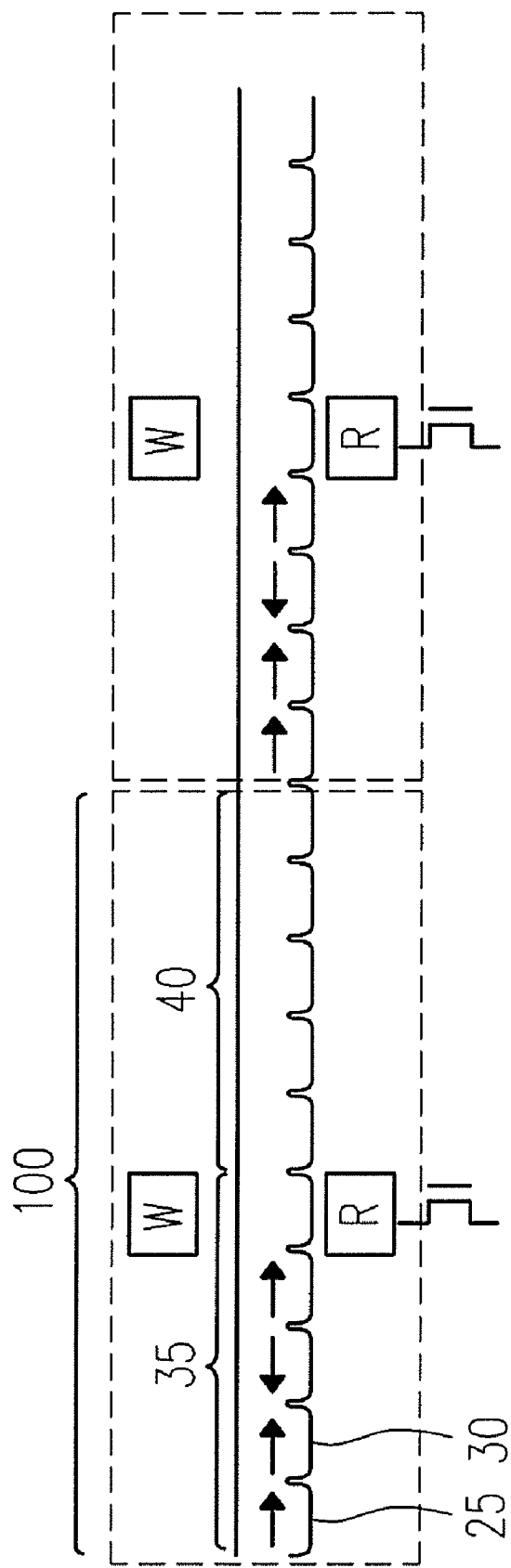
FIG. 2 is a schematic diagram illustrating a mechanism of the magnetic shift register of FIGS. 1A-1C.
Figure 3:
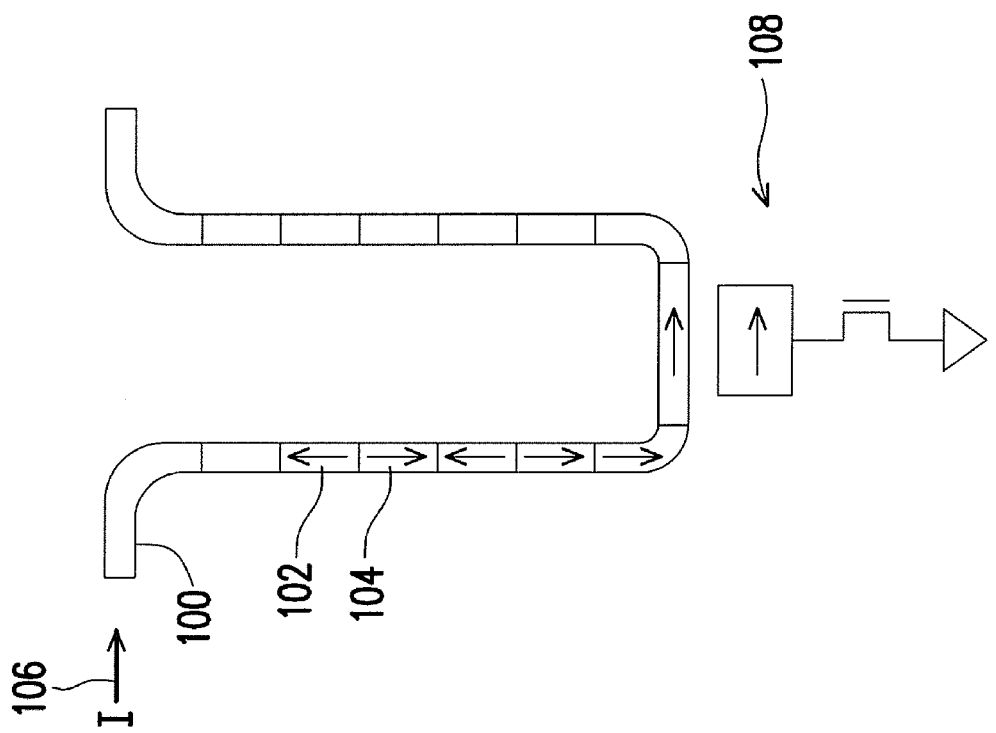
FIG. 3 is a schematic diagram illustrating a reading mechanism.
Figure 4:
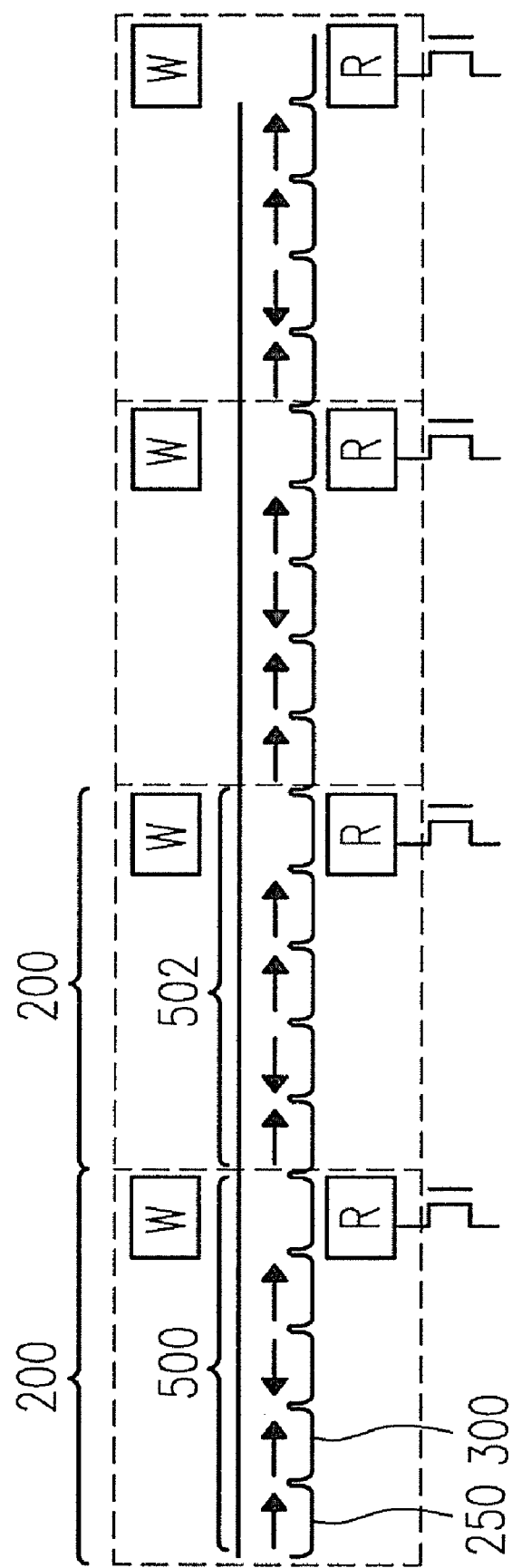
FIG. 4 is a schematic diagram illustrating a mechanism of a magnetic shift register according to an embodiment of the present invention.

FIG. 4 is a schematic diagram illustrating a mechanism of a magnetic shift register according to an embodiment of the present invention. Referring to FIG. 4, the magnetic shift register 200 for example includes at least a magnetic memory track. Taking one magnetic memory track as an example, a plurality of walls thereof separates the magnetic memory track into a plurality of magnetic bit memory cells 250 and 300, wherein the walls are implemented by notches to provide a pinning potential for the magnetic domains. The memory cells are divided into a plurality of adjacent data regions. Taking two data regions 500 and 502 as an example, the two data regions 500 and 502 are respectively formed by a predetermined number of the magnetic memory cells for respectively storing a plurality of bit data. In the present embodiment, data of four bits is taken as an example. For the data of the magnetic bit memory cells, a bit data is for example, recorded by a direction of a magnetization vector. The data of the memory cells on the magnetic memory track can be shifted between the adjacent two data regions 500 and 502 under an operation current. Each of the data regions 500 for example includes a reading position (R) and a writing position (W) for accessing data of the magnetic domains shifted to the corresponding position. Preferably, the reading position (R) and the writing position (W) can be disposed at an edge of the data region. Alternatively, the reading position (R) and the writing position (W) can be disposed at the same position.

According to the present embodiment, memory cells of each of the data regions 500 and 502 are used for recording data, and a reservoir region is not required. The data region 500 can be, for example, shifted to the data region 502. FIGS. 5A-5C are schematic diagrams illustrating an operation mechanism of a magnetic shift register according to an embodiment of the present invention. Referring to FIG. 5A, a magnetic track for example includes three data regions 500, 502 and 504, and each of the data regions has a recorded data of 6 bits. A pulse-type operation current 450 (which is also referred to as a current pulse 450) can be exerted to the magnetic track to shift the data of the memory cell 250. Referring to FIG. 5B, when the operation current 450 is activated, the data on the magnetic track is sequentially shifted to the right, and passes through the reading position (R) and the writing position (W) coupled to corresponding driving circuits, so as to perform the accessing operation.

In the present embodiment, if the data region 504 is located at a most edge of the magnetic track, the data thereof is shifted to a buffer region, which is known by those skilled in the art. Moreover, the operation current 450 can be inversed, so that the data can be shifted back to a position of a quiescent state. A direction of the operation current is determined according to different definitions. Generally, a direction of an electron flow and a moving direction of the domain wall are in accordance with a moving direction of the memory cell 250.

Referring to FIG. 5C, after one operating cycle, the data region 500 is shifted to the data region 502, and meanwhile the 6 bits of the data region 500 are all read while passing through the reading position (R). If the stored data stored is about to be changed, the new data can be written by a writing circuit. After the accessing is completed, the data of the current data region 502 can be shifted back to a state shown in FIG. 5A.

Figure 6:
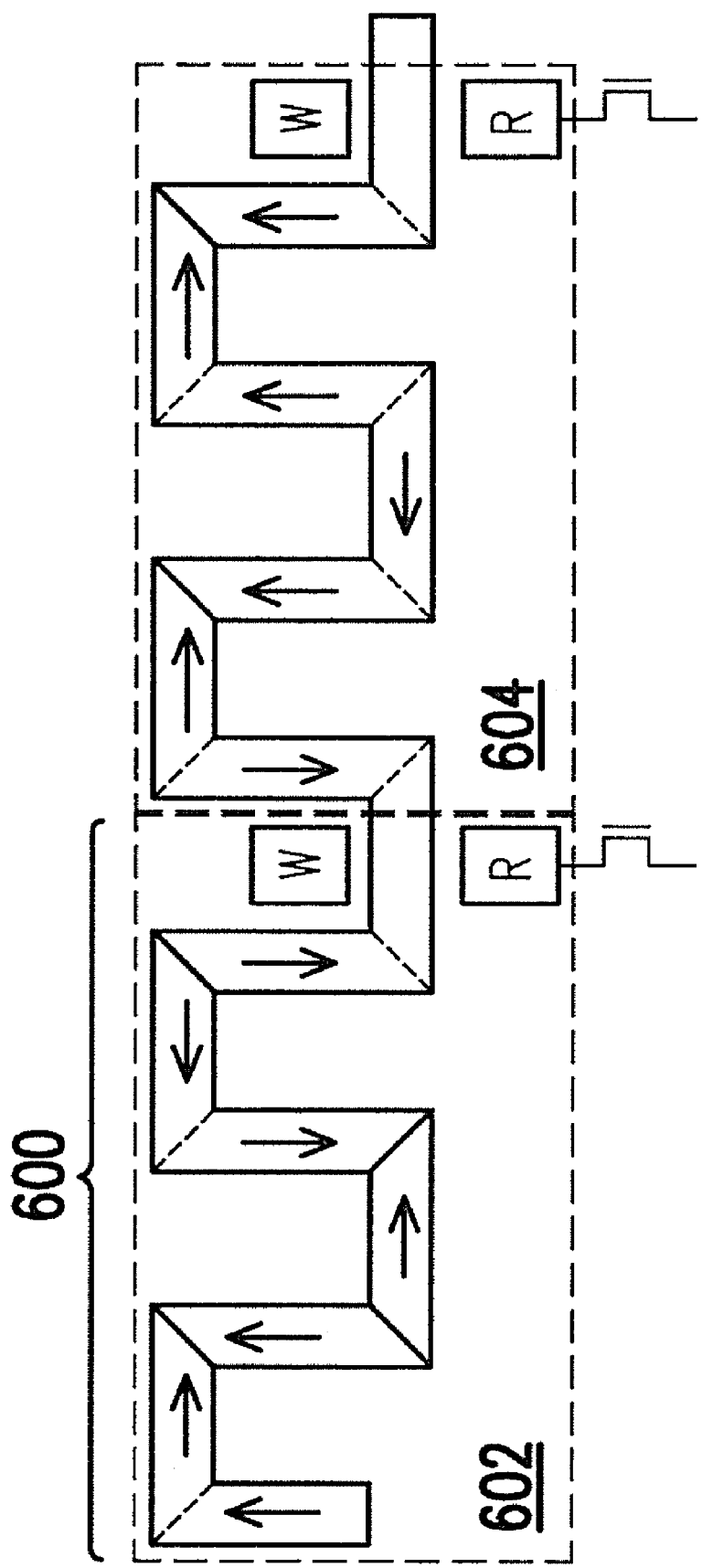
FIG. 6 is a schematic diagram illustrating a magnetic shift register structure according to an embodiment of the present invention.

The magnetic track of FIGS. 5A-5C is for example, disposed in a straight line, though the straight line is not the only option. FIG. 6 is a schematic diagram illustrating a magnetic shift register structure according to an embodiment of the present invention. Referring to FIG. 6, considering a space utilization, the magnetic track can be bended, so as to replace the function of the notch and to fully utilize the space. Taking a vertical folding as an example, an actual extending length of the magnetic track can be reduced. In other words, the data regions 602 and 604 of the magnetic shift register 600 are formed by folding memory cells. The plurality of magnetic bit memory cells of the magnetic shift register can achieve a magnetic moment pinning effect based on an angle variation thereof.

Figure 7:
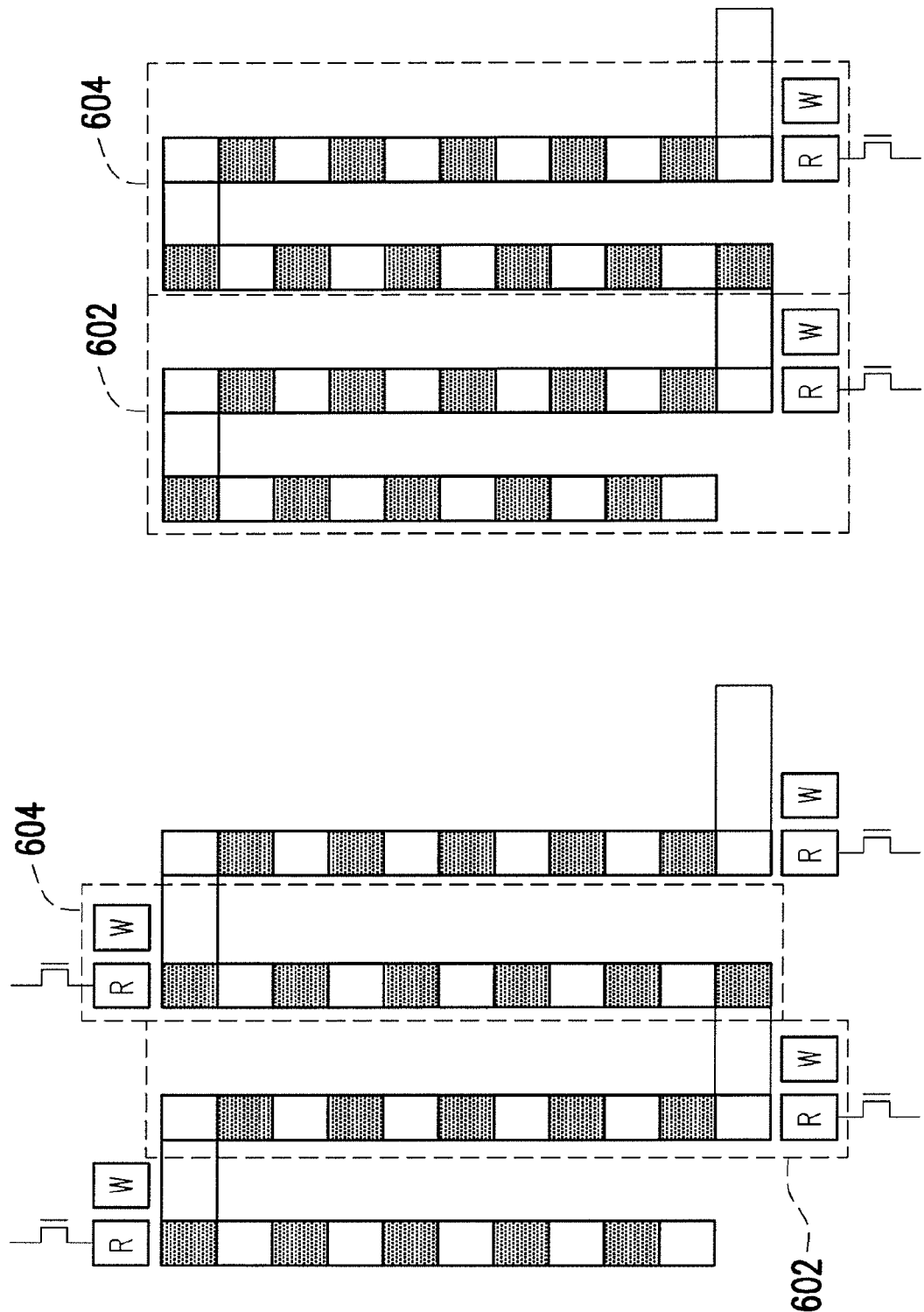
FIG. 7 is a schematic diagram illustrating a magnetic shift register structure according to an embodiment of the present invention.

FIG. 7 is a schematic diagram illustrating a magnetic shift register structure according to an embodiment of the present invention. Further, the data regions 602 and 604 of the magnetic shift register 600 (not shown) can be more effectively folded in a vertical dimension. In a left diagram of FIG. 7, the magnetic shift register is folded based on the data regions 602 and 604. Moreover, as shown in the left diagram, each of the data regions 602 and 604 may have a bending fold.

In other words, by folding the magnetic shift register, more space can be utilized. The magnetic domains on the magnetic track can achieve the pinning effect by applying the same magnetic material and a notch fabrication to the whole bit data region. Moreover, the adjacent magnetic domains on the magnetic track can also achieve the pinning effect by sequentially plating different magnetic materials, for example, alternately plating of NiFe—CoFe—NiFe—CoFe. In the left diagram of FIG. 7, one set of the reading device (R)/writing device (W) is respectively disposed on a top plane and a bottom plane, which is suitable for a 3D-IC application. The reading device (R)/writing device (W) of a right diagram of FIG. 7 is for example disposed on a silicon substrate, and the magnetic tracks are stacked upwards to form a U-type bit data region through a connection of the upper layer. Such structure can increase a storage space, and can be referred to as a vertical magnetic shift register.

Figure 8:
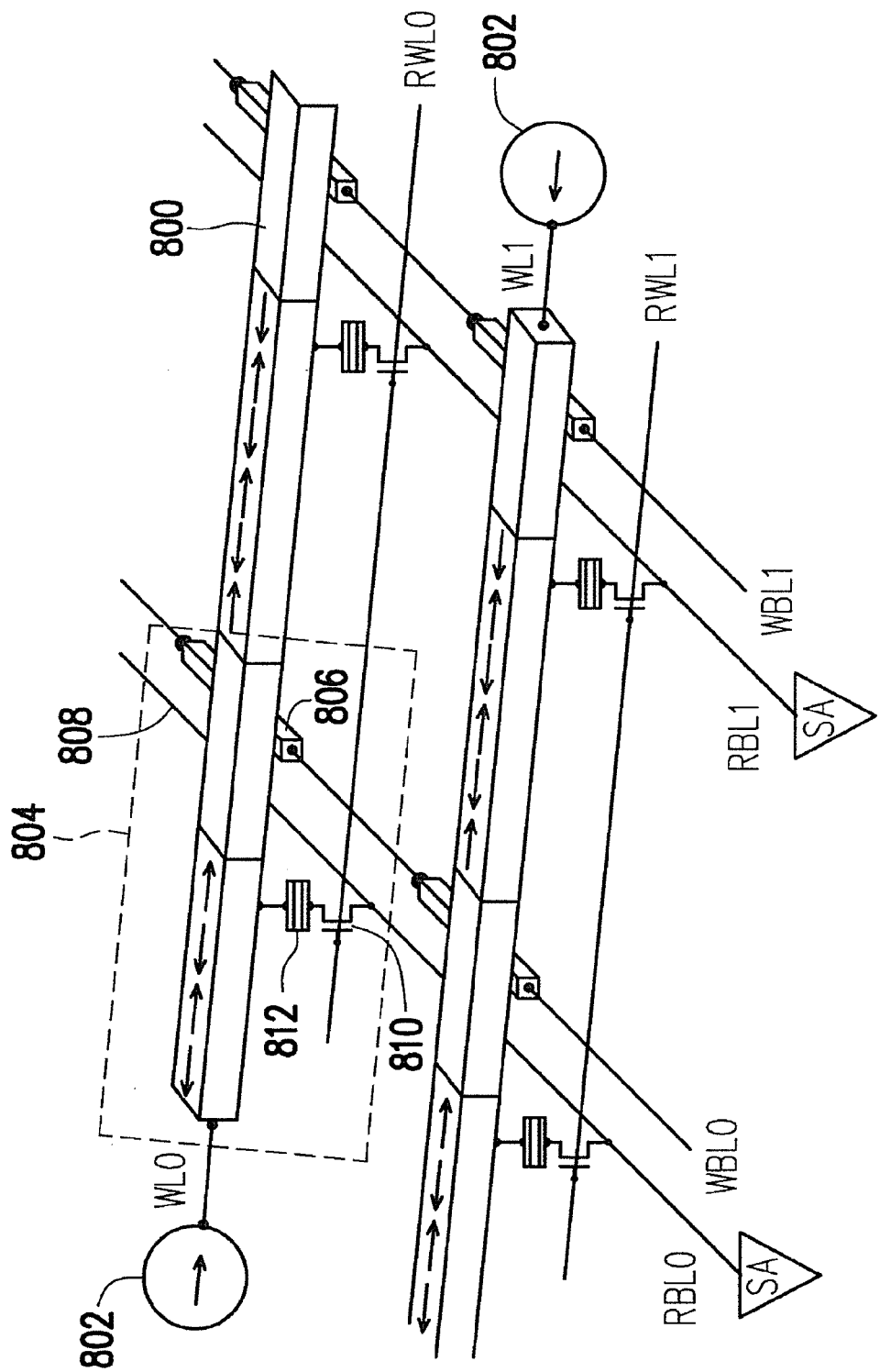
FIG. 8 is a schematic diagram illustrating a magnetic shift register structure according to an embodiment of the present invention.

FIG. 8 is a schematic diagram illustrating a magnetic shift register structure according to an embodiment of the present invention. The magnetic shift register structure for example includes a plurality of magnetic memory tracks 800 disposed in parallel. Each of the magnetic memory tracks 800 has a plurality of magnetic bit memory cells separated by a plurality of walls, in which the magnetic bit memory cells are shown as arrows of magnetization vectors. A data region 804 is formed by a predetermined number of magnetic bit memory cells on each of the magnetic memory tracks 800, which is used for storing a plurality of bit data. The magnetic memory track 800 can also be referred to as a track 800.

A current driving unit 802 exerts an operation current to the selected magnetic memory track 800 via writing lines WL0, WL1, . . . , so as to shift the magnetic bit memory cells of the data region 804 to an adjacent data region. A reading circuit unit includes devices 812 and 810, and has a reading position at each of the data regions, so as to read a bit data of the magnetic bit memory cell passing through the reading position within the selected data region. A writing circuit unit includes a device 806, and has a writing position at each of the data region, so as to write a bit data into the magnetic bit memory cell passing through the reading position within the selected data region.

In detail, a 2×2 array of the aforementioned various magnetic shift registers is taken as an example, a set of shift register unit cell 804 includes the aforementioned magnetic shift register which can store a plurality of bit data. One end of the reading device (for example, a magnetic tunnel junction (MTJ) device 812) is connected to the track 800, and another end thereof is connected to a drain of a select transistor 810. The select transistor 810 can be a NMOS or a PMOS transistor. A gate of the select transistor 810 is connected to a read word line (RWL0), and a source thereof is connected to a read bit line (RBL0), wherein the read bit line is disposed at periphery of the array and is connected to a sense amplifier, so as to read a logic value of the bit data. The writing devices of the magnetic shift register are formed by magnetic metal material and are connected to form a write bit line (WBL0). The tracks of the adjacent magnetic shift registers are connected to form a word line (WL0). During data reading, a forward or an inverted current pulse provided by the current driving unit 802 is input to the word line WL0, so that the bit data of the shift register is sequentially registered to a right-side shift register by the writing device, or the bit data registered in the right-side shift register is sequentially shifted back to an original position. Similarly, during the data writing, the forward current pulse is input to the word line WL0, so as to stay the bit data to be written at a position where the writing device is located. Now, a forward current (representing to write a data 0) or an inverted current (representing to write a data 1) is input to the write bit line (WBL0) to generate an Ampere's field and to implement the data writing. The write bit line (WBL) can also apply the current-driven domain wall motion (DWM). For example, if the forward current is input to the WBL, a stray field of one direction can be shifted to a data writing position, so that a track data is written with 0. Similarly, if the inverted current is input to the WBL, the stray field of another direction can be shifted to the data writing position, so that the track data is written with 1. After the data writing is completed, the inverted current pulse is input to the word line WL0, so that all of the bit data are sequentially shifted back to the original positions.

For actual operations, Table 1 is a flowchart for the reading operation, and Table 2 is a flowchart for the writing operation.

TABLE 1

| | WLx | RWLx | RBLy | WBLy | Note |
|---|---|---|---|---|---|
| T0 | X | X | X | X | |
| T1 | Forward pulse | on | SA on | X | DWM+; reading n bit |
| T2 | Inverted pulse | X | X | X | DWM−; shifting back |
| T3 | X | X | X | X | |

X = off

TABLE 2

| | WLx | RWLx | RBLy | WBLy | Note |
|---|---|---|---|---|---|
| T0 | X | X | X | X | |
| T1 | Forward pulse | X | X | Positive pulse (D-0) Negative pulse (D-1) | DWM+; writing n bit |
| T2 | Inverted pulse | X | X | X | DWM−; shifting back |
| T3 | X | X | X | X | |

X = off

In a reading flowchart of the Table 1, T0 represents a quiescent state, during which all of controls and signal lines are not activated. According to an operation principle and a definition of a general random access memory, during a cycle time, only one word line is activated, and meanwhile a plurality of the bit lines are activated for accessing data. These data lines can represent a data input/output (I/O) amount, or can be referred to as a word length. Taking a general 16 bits memory as an example, during one cycle time, one word line is activated, and meanwhile 16 bit lines are activated for accessing data. During a time T1, the read word line RWL is activated, and the select transistor connected to the reading device MTJ is activated. The forward current pulse is input to the word line WL, so that the bit data stored in the bit data region is sequentially shifted to the position where the reading device is located. Now, the sense amplifier SA connected to the read bit line RBL is activated, and the bit data is read. Then, the read bit data is sequentially registered to the bit data region of the adjacent shift register. During a time T2, the sense amplifier SA is turned off, and the read word line RWL is also turned off. Now, the inverted current pulse is input to the word line WL, so that the bit data registered to the adjacent bit data region is shifted back to the original position. During a time T3, all of the controls and signals are turned off, and the quiescent state of the time T0 is repeated.

In a writing flowchart of the Table 2, T0 represents a quiescent state, during which all of controls and signal lines are not activated. During the time T1, the read word line RWL is not activated, and now the forward current pulse 450 is input to the word line WL, by which the bit data stored in the bit data region is sequentially shifted to the position wherein the writing device is located. When each of the bit data is stayed at the position where the writing device is located, the current pulse with a different direction is input to the write bit line WBL according different data to be written. For example, if the data 0 is about to be written, the forward current pulse is input to the write bit line WBL, so that the Ampere's field or stray field of one direction that can change the magnetic domain to the data 0 is shifted to the data writing position, so as to complete the writing operation of the magnetic domain. Similarly, if the data 1 is about to be written, the inverted current pulse is input to the write bit line WBL, so that the Ampere's field or stray field of another direction that can change the magnetic domain to the data 1 is shifted to the data writing position, so as to complete the writing operation of the magnetic domain. During the time T1, each of the written bit data is sequentially registered to the bit data region of the adjacent shift register. During the time T2, the inverted current pulse is input to the word line WL, so as to shift the bit data registered in the adjacent bit data region back to the original position. During the time T3, all of the controls and the signals are turned off, and all of the data is stored at a position the same as that during the time T0.

In other words, the operation method of the magnetic shift register can be applied to the aforementioned magnetic shift registers. The magnetic shift register includes at least one magnetic memory track, and a plurality of walls separate the memory track into a plurality of the magnetic bit memory cells. At least a first data region and an adjacent second data region are respectively formed by a predetermined number of the magnetic bit memory cells, and are used for storing a plurality of bit data, wherein the bit data of the magnetic bit memory cells is shifted between the at least two adjacent data regions under an operation current.

The operation method includes following steps. First, a first current pulse of a first direction is input to the selected magnetic memory track. Wherein, one pulse shifts one bit of data, so as to shift a plurality of data stored in the first data region from an original position to the second data region. A reading step is to read a bit data of the magnetic bit memory cell passing through a reading position. A writing step is to write a bit data into the magnetic bit memory cell passing through a writing position. After the data accessing, a second current pulse having a direction inverted to the first direction is exerted, so as to shift the first data region and the second data region back to the original positions.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic shift register, comprising:
   at least a magnetic memory track, having a plurality of magnetic domains to serve as a plurality of magnetic bit memory cells, wherein the magnetic memory track comprises:
   a plurality of data regions, wherein each of the data regions has a plurality of the magnetic bit memory cells for respectively storing a plurality of bit data at a quiescent state and registering at least one of the bit data directly shifted from an adjacent data region at a shifting state;
   a reading circuit, disposed at a reading position of each of the data regions for reading a bit data of the magnetic bit memory cell shifted to the reading position; and a writing circuit, disposed at a writing position of each of the data regions for writing a bit data into the magnetic bit memory cell shifted to the writing position, wherein the bit data of the magnetic bit memory cells is directly shifted between two adjacent data regions under an operation current.

2. The magnetic shift register as claimed in claim 1, wherein the reading position and the writing position of each of the data regions are located at an edge of the data region.

3. The magnetic shift register as claimed in claim 2, wherein the reading position and the writing position are located at a same accessing cell position.

4. The magnetic shift register as claimed in claim 1, wherein the magnetic bit memory cells of the magnetic memory track are disposed in a straight line.

5. The magnetic shift register as claimed in claim 1, wherein the magnetic bit memory cells of the magnetic memory track are bended.

6. The magnetic shift register as claimed in claim 5, wherein the magnetic memory track is folded based on the data regions.

7. The magnetic shift register as claimed in claim 5, wherein each of the data regions has a bending fold.

8. The magnetic shift register as claimed in claim 5, wherein each of the data regions is folded based on each of the magnetic bit memory cells.

9. A magnetic shift register structure, comprising:
a plurality of magnetic memory tracks, wherein each of the magnetic memory tracks has a plurality of magnetic bit memory cells, each of the magnetic memory tracks has a plurality of data regions, and each of the data regions has a plurality of the magnetic bit memory cells for respectively storing a plurality of bit data at a quiescent state and registering at least one of the bit data directly shifted from the adjacent data region at a shifting state;

a current driving unit, exerting an operation current to a selected magnetic memory track to directly shift the magnetic bit memory cells of a data region to an adjacent data region;

a reading circuit unit, having a reading position at each of the data regions for reading a bit data of a magnetic bit memory cell passing through the reading position within the selected data region; and a writing circuit unit, having a writing position at each of the data regions for writing a bit data into a magnetic bit memory cell passing through the writing position within the selected data region.

10. The magnetic shift register structure as claimed in claim 9, wherein the reading position and the writing position of each of the data regions are located at an edge of the data region.

11. The magnetic shift register structure as claimed in claim 9, wherein the reading position and the writing position are located at a same accessing cell position.

12. The magnetic shift register structure as claimed in claim 9, wherein the magnetic memory tracks are disposed in parallel straight lines.

13. The magnetic shift register structure as claimed in claim 9, wherein the magnetic bit memory cells of the magnetic memory track are bended.

14. The magnetic shift register structure as claimed in claim 13, wherein the magnetic memory track is folded based on the data regions.

15. The magnetic shift register structure as claimed in claim 13, wherein each of the data regions has a bending fold.

16. The magnetic shift register structure as claimed in claim 13, wherein each of the data regions is folded based on each of the magnetic bit memory cells.

17. A method for operating a magnetic shift register, wherein the magnetic shift register comprises at least a magnetic memory track, having a plurality of magnetic bit memory cells, and the magnetic memory track comprises at least one first data region and an adjacent second data region, the first data region and the second data region have a same amount of the magnetic bit memory cells, and the first data region stores a plurality of bit data at a quiescent state and registers at least one of the bit data shifted from the second data region at a shifting state, wherein the bit data of the magnetic bit memory cells is directly shifted between the at least two data regions under an operation current, and the method comprises:

exerting a first current pulse of a first direction to the selected magnetic memory track, wherein one pulse shifts one bit of data, so as to directly shift a plurality of data stored in the first data region from an original position to the second data region;

performing a reading step, for reading a bit data of the magnetic bit memory cell passing through a reading position;

performing a writing step, for writing a bit data into the magnetic bit memory cell passing through a writing position; and exerting a second current pulse having a direction inverted to the first direction for shifting the first data region and the second data region back to the original positions.

18. The method for operating a magnetic shift register as claimed in claim 17, wherein the reading position and the writing position of each of the data regions are located at an edge of the data region.

19. The method for operating a magnetic shift register as claimed in claim 18, wherein the reading position and the writing position are located at a same accessing cell position.

* * * * *